US011520498B2

(12) United States Patent
Bonen et al.

(10) Patent No.: US 11,520,498 B2
(45) Date of Patent: Dec. 6, 2022

(54) MEMORY MANAGEMENT TO IMPROVE POWER PERFORMANCE

(71) Applicant: Intel Corporation, Santa Clara, CA (US)

(72) Inventors: Nadav Bonen, Ofer Z (IL); Sridhar Muthrasanallur, Bangalore (IN); Srinivas Pandruvada, Beaverton, OR (US); Vishwanath Somayaji, Haralur Bangalore (IN); Prashant Kodali, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/116,991

(22) Filed: Dec. 9, 2020

(65) Prior Publication Data

US 2021/0405892 A1 Dec. 30, 2021

(30) Foreign Application Priority Data

Jun. 25, 2020 (IN) .............................. 202041026926

(51) Int. Cl.
*G06F 3/06* (2006.01)
(52) U.S. Cl.
CPC .......... *G06F 3/0625* (2013.01); *G06F 3/0644* (2013.01); *G06F 3/0652* (2013.01); *G06F 3/0673* (2013.01)

(58) Field of Classification Search
CPC .... G06F 3/0644; G06F 3/0613; G06F 3/0673; G06F 12/0862; G06F 3/0659; G06N 3/063; G06N 3/0445; G06N 3/0454
See application file for complete search history.

(56) References Cited

U.S. PATENT DOCUMENTS

| | | | | |
|---|---|---|---|---|
| 2011/0296095 A1* | 12/2011 | Su | ......................... | G06F 1/3275 |
| | | | | 711/E12.007 |
| 2015/0220135 A1* | 8/2015 | Huang | .................. | G06F 3/0647 |
| | | | | 713/320 |
| 2019/0065087 A1* | 2/2019 | Li | ......................... | G06F 3/0673 |
| 2020/0333981 A1* | 10/2020 | Liu | ....................... | G06F 3/0659 |

* cited by examiner

*Primary Examiner* — Zhuo H Li
(74) *Attorney, Agent, or Firm* — Schwabe, Williamson & Wyatt, P.C.

(57) ABSTRACT

Logical memory is divided into two regions. Data in the first region is always retained. The first region of memory is designated online (or powered on) and is not offlined during standby or low power mode. The second region is the rest of the memory which can be potentially placed in non-self-refresh mode during standby by offlining the memory region. Content in the second region can be moved to the first region or can be flushed to another memory managed by the operating system. When the first region does not have enough space to accommodate data from the second region, the operating system can increase the logical size of the first region. Retaining the content of the first region by putting that region in self-refresh and saving power in the second region by not putting it in self-refresh is performed by an improved Partial Array Self Refresh scheme.

21 Claims, 6 Drawing Sheets

MEMORY MANAGEMENT TO IMPROVE POWER PERFORMANCE

CLAIM FOR PRIORITY

This application claims the benefit of priority to Indian Patent Application No. 202041026926, filed on Jun. 25, 2020, titled "Memory Management to Improve Power Performance", and which is incorporated by reference in entirety.

BACKGROUND

More than 20% to 50% of mobile stand-by power is attributed towards memory (e.g., dynamic random access memory (DRAM)) self-refresh. DRAM consists of a transistor and a capacitor. The capacitor is charged regularly for it to retain the data. So, even during standby the DRAM continuously consumes power to retain data. Consider a system with 8 GB random access memory (RAM). Higher RAM is needed in a system for better performance but has the side-effect of draining more power due to higher number of capacitors to refresh.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

When a system is idle and nothing much is running in the background, the RAM utilization of the system is low (e.g., just half). This can further be reduced by flushing. Currently in most computing systems (e.g., mobile devices such as phones, laptops, tablets) refresh current is passed through the RAM to refresh the entire 100% of RAM space even if 50% of the space is being used. The excess refresh current is a waste of power. One way to reduce this excess refresh is by refreshing at lower level granularity. In that regards, the RAM is divided into several segments or banks. Each segment can be individually refreshed. For example, if only four segments from a total of eight segments contain valid data, then merely four segments can be refreshed, the other segments may not be refreshed, thus saving power. This selective refresh technique is generally referred to as Partial Array Self Refresh (PASR).

As requirements or goals for standby battery life for computing devices (e.g., laptops) is becoming aggressive (e.g., 21 days for a Chromebook laptop) while RAM size is increasing (e.g., DRAM size is 16 GB or more), hardware-based selective refresh is not enough to extend standby battery life. Memory power consumption during standby can be anywhere between 8 mW to 20 mW on an 8 GB low power double data rate (LPDDR4) system which is around 15% to 35% of total platform power of the computer system.

Various embodiments optimize hardware and software for a computer system to improve standby battery life. While various embodiments are described with reference to Linux operating system, the embodiments can be used for other operating systems. Linux provides memory offline features where a section of memory can be logically hot plugged. In this case, an entire memory can be divided into two regions. Data in the first region is always retained. For example, the first region contains memory such as locked, paged, non-swappable content, etc., which cannot be moved or flushed. The first region of memory is designated online (or powered on) and is not offlined during standby or low power mode.

The second region is the rest of the memory which can be potentially placed in non-self-refresh mode during standby by offlining the memory region. Here, offlining refers to making the memory inaccessible by either removing communication to it or cutting the power to that memory region. In some embodiments, content in the second region can be moved. For example, the content can be moved to the first region if there is space or can be flushed to another memory which is managed by Linux operating system. In some embodiments, when the first region does not have enough space to accommodate data from the second region, the operating system can increase the logical size of the first region.

As used in various embodiments, here retaining the content of the first region by putting that region in self-refresh and saving power in the second region by not putting it in self-refresh is referred to as the improved Partial Array Self Refresh (iPASR). So, the use of PASR in various embodiment is iPASR. In some embodiments, power saving is achieved by opportunistically offlining memory in the second region and placing it in non-self-refresh mode during standby entry or low power mode. Content in the second region is either moved to the first region (if space is available and/or expanding the size of the first region) or flushed to disk (or external memory). When the system exits from standby or low power mode, the second region is out of iPASR mode and fully available to the operating system for its disposal. In some embodiments, this intelligence (also referred to as iPASR Manager) is implemented in a user space application. While the iPASR Manager is described with reference to a software application in the user space, which is above the kernel space in the software abstraction, iPASR Manager can be integrated in the operating system directly. As such, iPASR Manager can be a standalone application, integrated in a firmware of a system-on-chip (SoC), integrated in a power management software (proprietary or accessible via an application programming interface API), in a driver, etc.

In some embodiments, an apparatus (e.g., processor system) is provided which comprises a memory (e.g., dynamic random access memory) which is logically partitioned into a first section and a second section, wherein the first section is online in a low power mode (e.g., standby mode). The apparatus further comprises logic (e.g., operating system, driver, and/or application software such as iPASR manager run on the operating system) to determine whether user memory in the second section is greater than available space in the first section. In some embodiments, the apparatus comprises a power control unit communicatively coupled to the memory. The power control unit receives instructions from an operating system to move contents from the second section to the first section in response to a determination by the logic that the user memory in the second section is less than the available space in the first section. In some embodiments, the memory is a first memory, and the power control unit receives instructions from the operating system to move contents from the second section to a second memory (e.g., a non-volatile external memory) separate from the first memory in response to a determination by the logic that the user memory in the second section is greater than the available space in the first section.

In some embodiments, the logic determines or estimates a duration the apparatus is expected to stay in the low power mode (e.g., standby mode). In some embodiments, the logic determines or estimates the duration via user behavior and/or heuristics. In some embodiments, the logic compares the duration with a threshold and flushes the contents of the second section and place the section in partial array self-refresh mode in response to a determination that the duration is longer than the threshold.

In some embodiments, the logic determines an imminent wakeup event from the low power mode in response to a determination that the duration is less than the threshold. In some embodiments, the logic identifies a number of memory segments in the section to enter the partial array self-refresh mode in response to the determination that there is no imminent wakeup event. In some embodiments, the logic bypasses the partial array self-refresh mode and enables a self-refresh mode for the second section in response to the determination that there is an imminent wakeup event.

In some embodiments, the logic determines whether a power down button was pressed to estimate the duration, and to flush the contents of the second section and place the section in partial array self-refresh mode in response to a determination that the power down button was pressed. In some embodiments, the logic determines whether a lid or display screen was shut and estimates the duration and determines an imminent wakeup event from the low power mode in response to a determination that lid or display screen was shut.

In some embodiments, the logic identifies a number of memory segments in the section to enter the partial array self-refresh mode in response to the determination that there is no imminent wakeup event. In some embodiments, the logic bypasses the partial array self-refresh mode and enables a self-refresh mode for the second section in response to the determination that there is an imminent wakeup event.

There are many technical effects of various embodiments. For example, iPASR results in significant improvement in standby battery power consumption on DDR or LPDDR based systems. In one example, 0.6-1.7 mW/GB power savings are realized using the iPASR. This means that on a 16 GB system, iPASR results in 13% to 26% improvement in standby power depending on the memory vendor. On a 32 GB system, standby battery life improvement is between 20% and 35%. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal.

The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom" "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1:
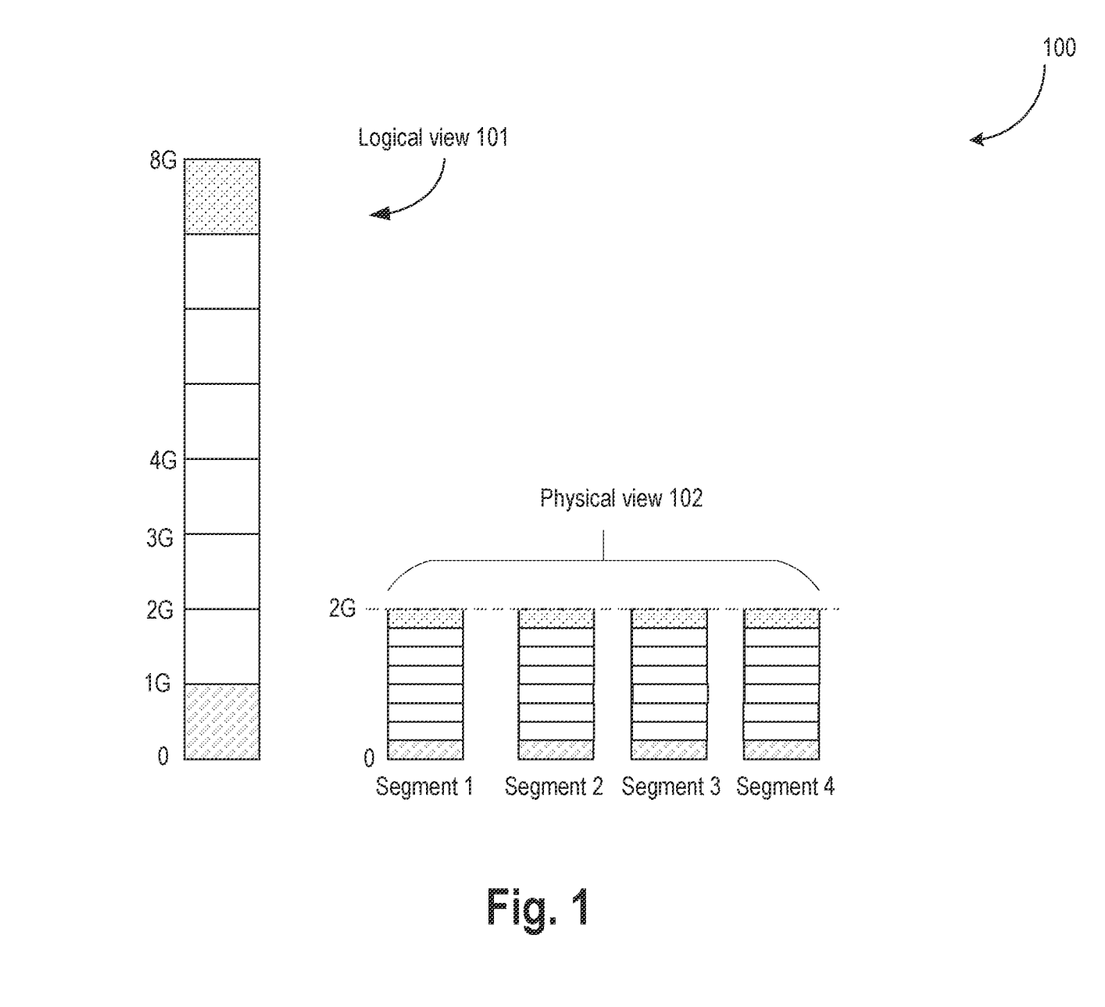
FIG. 1 illustrates a memory view showing logical and physical partitions for partial array self-refresh.

FIG. 1 illustrates memory view 100 showing logical partition 101 and physical partition 102 for partial array self-refresh. In this example, logical view 101 shows a contiguous memory space of 8 GB. The physical view of the memory depends on the number of segments or banks of the memory array. Each segment is contiguous in physical address space but can span across different channels, ranks or banks. In this example, four segments are shown in the physical view 102. In various embodiments, traditional PASR feature is combined with the iPASR scheme to achieve better battery life during low power mode. In PASR, partial array self-refresh, DRAM memory is split to 8 segments. PSAR allows the option to refresh or not refresh a segment when a device is in self-refresh. DRAM segments correspond to ⅛th chunks of the host's physical address. This means that if there is no valid data in a segment, the segment refresh can be turned off and standby power can be saved.

Figure 2:
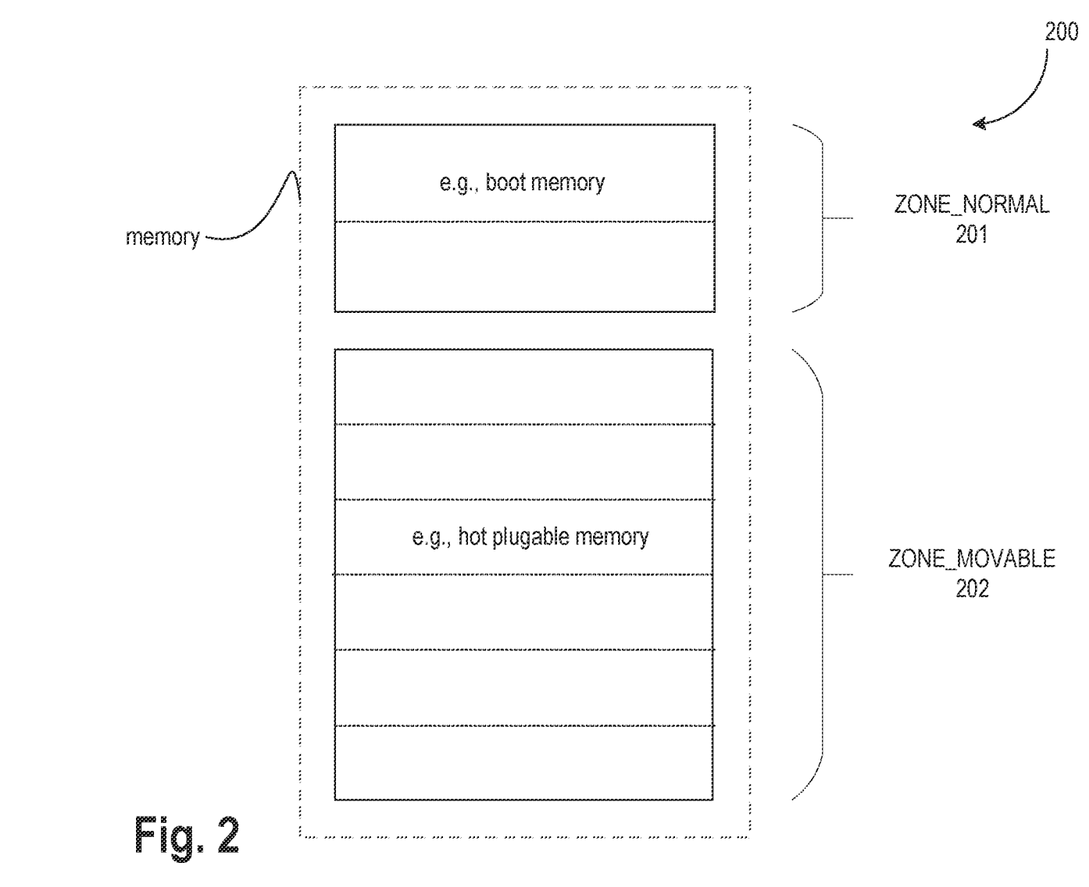
FIG. 2 illustrates a logical view of a memory partitioned by an operating system to reduce power consumption, in accordance with some embodiments.

FIG. 2 illustrates logical view 200 of a memory partitioned by an operating system to reduce power consumption, in accordance with some embodiments. Linux operating system provides a memory offline feature where a section of memory can be logically hot plugged. In Linux operating system, memory (e.g., DRAM) can be partitioned as sections which can be individually offlined. When memory is offlined, it is out of bounds for the operating system and hence may not be accessed by the operating system. A group of Linux memory sections can be mapped to a DRAM segment. When all the memory sections are offlined, then that DRAM segment can be placed in PASR mode (where self-refresh is disabled), in accordance with some embodiments.

In Linux operating system, an entire memory is partitioned into two memory partitions namely ZONE_NORMAL 201 and ZONE_MOVABLE 202. ZONE_NORMAL 201 comprises memory sections which are never offlined. So all the memory pages which cannot be moved (e.g., locked pages, non-swappable pages, memory allotted for graphics processor unit (GPU), etc.) are part of the ZONE_NORMAL memory. ZONE_MOVABLE 202 is the section of memory which can be offlined and it can be placed in PASR mode during standby by offlining the memory region. Content in the ZONE_MOVABLE region 202 can be moved. For example, the content in the ZONE_MOVABLE region 202 can be relocated to ZONE_NORMAL 201 if there is space available in that memory region, or can be flushed to another memory (e.g., hard disk drive, non-volatile memory such as magnetic random access memory, resistive random access memory, ferroelectric memory, NAND flash memory, NOR flash memory, etc.) which is managed by Linux operating system. One example of the other memory is illustrated by storage devices 2428 and/or memory 2430 of FIG. 6. Referring back to FIG. 2, in the Chrome operating system not more than 1.5 GB of memory is used during boot or when the computer system is idle. As such, in some embodiment, on an 8 GB system, 2 GB is reserved as boot memory in ZONE_NORMAL and the rest of 6 GB in ZONE_MOVABLE. In some embodiments, 6 GB of memory is placed in PASR mode during standby.

While various embodiments are illustrated with reference to a DRAM memory, the embodiments are applicable to any memory that requires a self-refresh or a similar mechanism to maintain data in the memory. Also, while the embodiments are described with respect to Linux operating system, the embodiments are applicable to any operating system (e.g., Android, Apple iOS, Windows, Chrome, etc.) that can interface with user applications and manage memory space.

Figure 3:
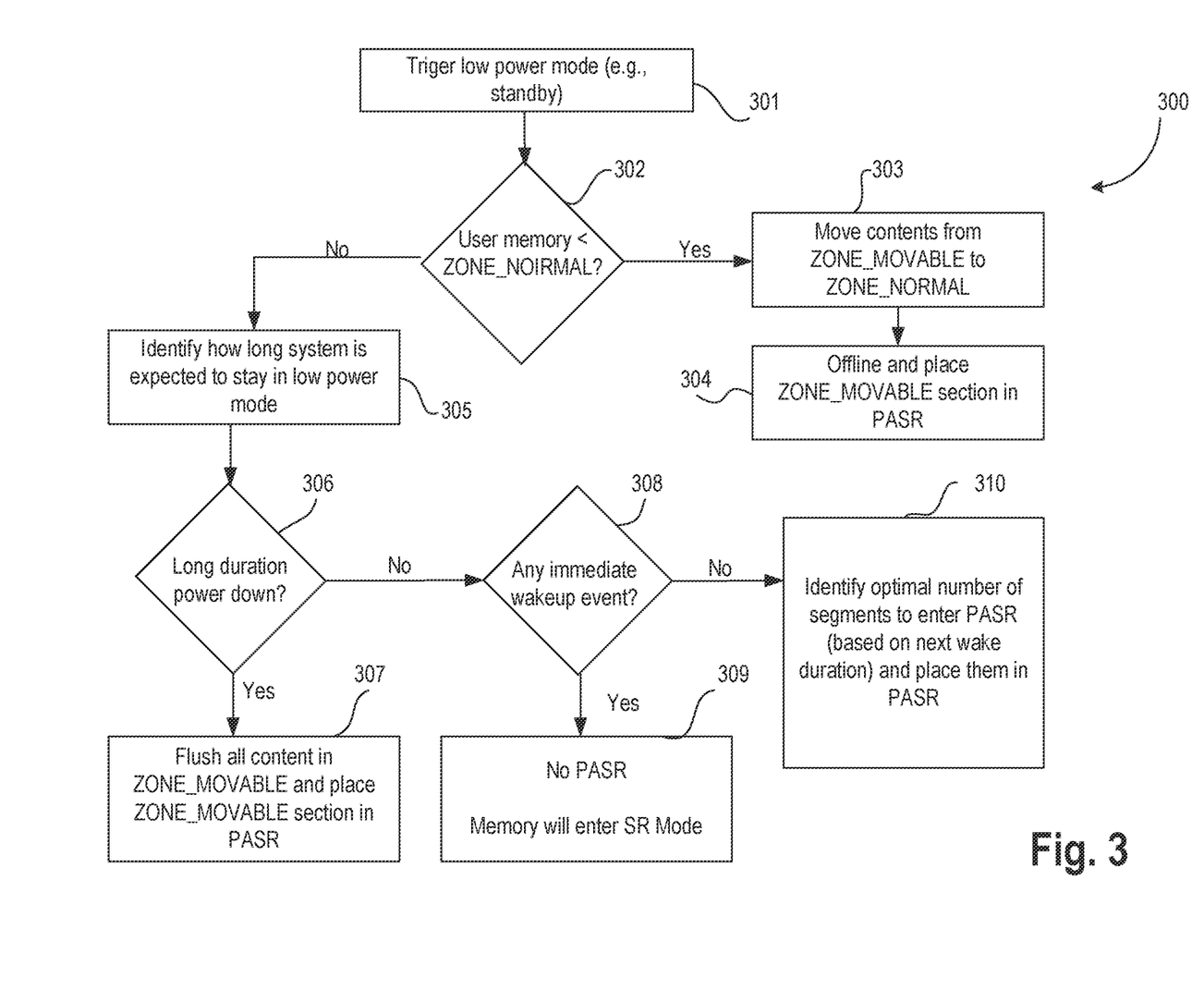
FIG. 3 illustrates a flowchart of partial array self-refresh to manage memory power performance, in accordance with some embodiments.

FIG. 3 illustrates flowchart 300 of improved partial array self-refresh to manage (iPASR) memory power performance, in accordance with some embodiments. While various operation blocks or method processes are shown in a particular order, the order can be modified. For example, some blocks can be performed before others while some blocks can be performed simultaneously or parallel to other blocks. In some embodiments, during standby entry or low power mode entry, ZONE_MOVABLE memory section is offlined and corresponding memory segments are placed in PASR mode. In some embodiments, during the exit of standby entry or low power mode, PASR memory segments are brought out of PASR mode and the memory regions are onlined so that an entire memory is accessible to the operating system. In some embodiments, a PASR manager is provided which delivers the core logic for achieving memory PASR during standby. In some embodiments, PASR manager is a user space memory policy manager which determines when to place the memory in PASR and how much of memory can be placed in PASR. In Various operation blocks of flowchart 300 are performed by PASR manager, which implements the iPASR scheme. PASR manager may implement the entire iPASR scheme, or part of it while enabling other logic modules such as operating system kernel, kernel drivers, hardware firmware, etc. to implement part of the iPASR scheme. As such, PASR manger controls the power management decisions and outcomes via the operating system, drivers, and hardware firmware. In some embodiments, PASR manager may be entirely implemented in the operating system.

At block 301, PASR manager detects triggering of a low power mode such as standby mode. This indication can come from any suitable source. For example, an operating system may send a signal or message to the PASR manager informing it of the decision to enter standby mode. The decision to enter standby mode may be caused by an expiration of a timer that times idle time of the computer system, closing of a display lid of a laptop computer system, pressing a standby button or selection on the operating system, etc.

At block 302, PASR manager makes a determination about the current memory usage and compares it with the available memory in ZONE_NORMAL 201. If the PASR manager determines that the memory usage is less than the available memory in ZONE_NORMAL 201 then the process proceeds to block 303. At block 303, PASR manager instructs the operating system to instruct the hardware to move contents from ZONE_MOVABLE 202 to ZONE_NORMAL 201. The process then proceeds to block 304, where PASR manager causes the ZONE_MOVABLE 202 to be placed offline and applies PASR to ZONE_MOVABLE 202.

If the PASR manager determines that the memory usage is less than the available memory in ZONE_NORMAL 202, the process proceeds to block 305. In some embodiments, if the memory usage is less than the available memory in ZONE_NORMAL 20', the entire content of ZONE_MOVABLE 202 cannot be fitted in ZONE_NORMAL. In that case, when ZONE_MOVABLE 202 is offline, the operating system (e.g., Linux kernel) moves the contents from ZONE_MOVABLE 202 to an external disk such as non-volatile memory. In some embodiments, flushing ZONE_MOVABLE 202 is a time consuming operation. So depending on the time the computer system is expected to stay in standby, in some embodiments, PASR manager decides how much of memory from ZONE_MOVABLE 202 can be flushed to a disk and place associated memory segments of ZONE_MOVABLE 202 in the PASR mode.

A block 305, the PASR manager determines, estimates, or identifies how long the computer system is expected to stay in the low power mode. Such identification can be obtained from one or more sources. For example, PASR manager accesses heuristics about user behavior and schedule of entering or exiting the system to or from the low power mode (e.g., standby mode). Heuristics also include time of day and week. For example, when a user places the computer system in standby mode at night, it is likely to stay in that mode till morning. In another example, when a user places the computer system in standby mode during work week, it is likely to be for a short duration. In some embodiments, user behavior is captured over a period of time (e.g., days, weeks, months of computer usage) and a pattern is established as to when the user is expected to enter the system in standby and when the system is expected to exit standby. In some embodiments, machine-learning tools are used to train a model that accurately predicts when the system is to enter standby, duration of standby, and when it expects the system to exit standby.

At block 306, the PASR manager compares the estimated or identified time the computer system will remain in low power mode (e.g., standby mode) with a threshold (predetermined or programmable). In some embodiments, instead of comparing the estimated or identified time the computer system will remain in low power mode with a threshold, the PASR manager checks whether the low power mode was initiated by a power button event (e.g., user pressing the power button to go into standby mode) or by simply closing the lid of the laptop. Pressing the power button indicates a likelihood of a long standby mode while folding the lid of a computer laptop suggests a short standby mode. In any case, if the estimated time in standby mode is expected to be longer than the threshold or if the user pressed the power button to enter standby mode, the processor proceeds to block 307. If the estimated time in standby mode is expected to be shorter than the threshold or of the user closed the lid of the laptop to enter standby mode, the processor proceeds to block 308.

At block 307, the PASR manager causes content in ZONE_MOVABLE 202 to be flushed and places ZONE-MOVABLE 202 is PASR mode to save power consumption otherwise caused by self-refresh. At block 308, the PASR manager makes a determination or guess about any immediate wakeup event that may cause the system to wake up from standby mode. If there is determination that the system is expected stay in standby for shorter time (e.g., impending (e.g., real time clock (RTC) alarm etc.), the PASR manager causes the system to offline partial set of memory that can fit in ZONE_NORMAL 201 and places that segment in the PASR mode as indicated by block 310. The rest of the memory segments are retained. If none of above is possible because the system is expected to wake up immediately, the PASR manager may not place the memory section in PASR mode, which means that the memory section will enter self-refresh mode as indicated by block 309.

Figure 4:
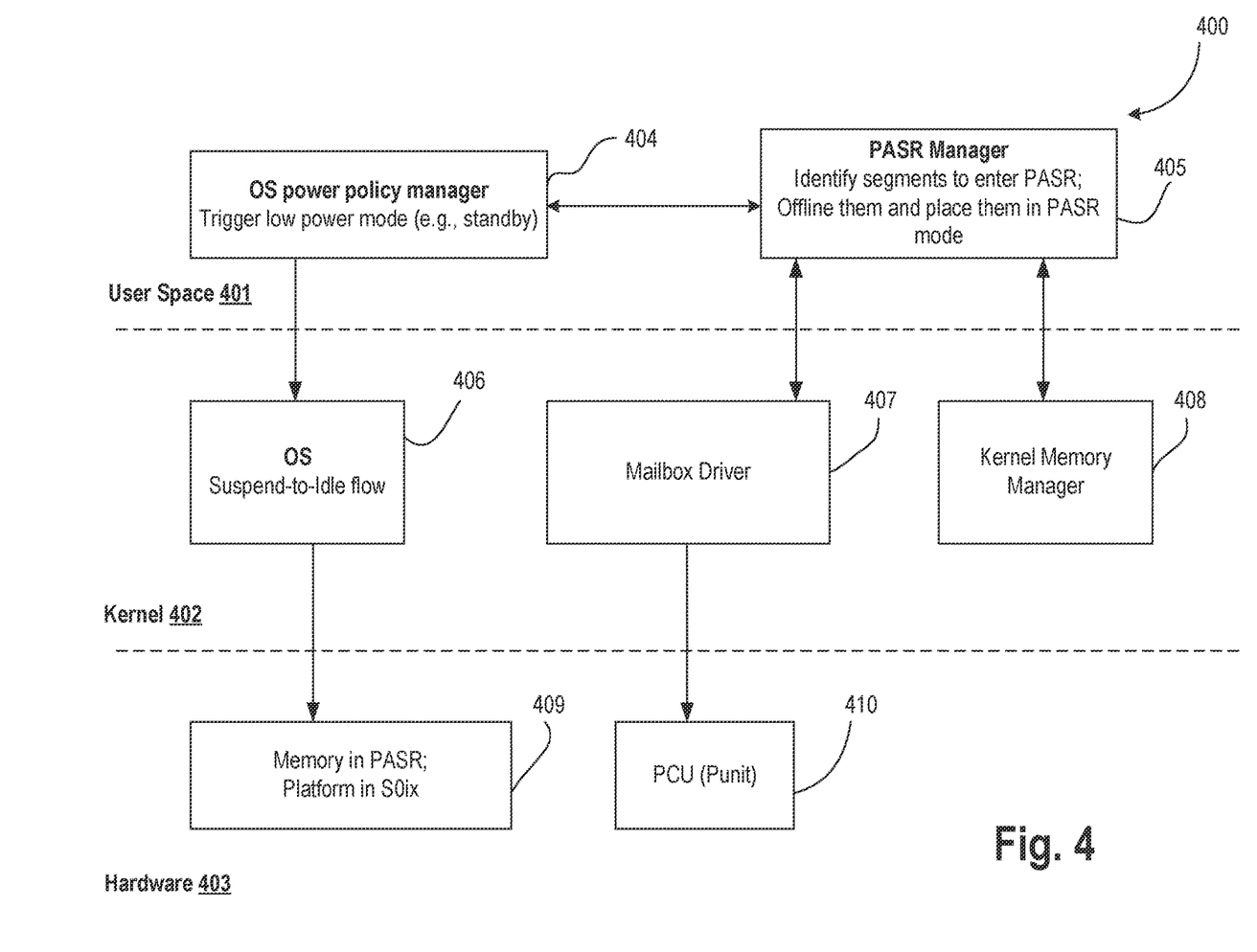
FIG. 4 illustrates a system-level flowchart for low power entry, in accordance with some embodiments.

FIG. 4 illustrates system-level flowchart 400 for low power entry (e.g., standby entry), in accordance with some embodiments. While various operation blocks are shown in a particular order, the order can be modified. For example, some blocks can be performed before others while some blocks can be performed simultaneously or parallel to other blocks. System-level flowchart 400 illustrates the system abstraction and communication between various abstraction layers. Here, the higher level abstraction is the user space 401 followed by Kernel 402 and hardware 403. User space 401 includes operating system (OS) power policy manager 404 and PASR manager 405. OS power policy manager 404 decides when to trigger low power mode or standby mode or determines when a system has entered the low power mode or standby mode. One example of an OS power policy manager 404 is Chrome PowerD. PASR manager 405 performs the various functions described with reference to FIG. 3 including identifying memory segments to enter PASR, and offlining memory segments and placing them in PASR mode during standby entry (or low power mode entry). In various embodiments, PASR Manager 304 receives hints from OS power policy manager 404 about standby entry/exit events.

Kernel 402 includes operating system suspend-to-idle flow (software) 406, mailbox driver 407, and kernel memory manager 408. Operating system suspend-to-idle flow 406 is a traditional software module in kernel 402 that allows policy manager 404 to interact with hardware memory 409. Operating system suspend-to-idle flow 406 handles the interrupts associated with OS power policy manager 404 triggering a standby event. OS power policy manager 404 keeps track of system activity, determines the appropriate system power state, and initiates various power savings features like dimming the screen, suspending the system, etc. OS power policy manager 404 also provides interfaces through which applications can read and write power policy settings.

Mailbox driver 407 interfaces with power control unit (PCU) or power unit (Punit) 410 to enable/disable PASR mode. One example of PCU 401 is illustrated by PCU 2410a and/or PCU 2410b of FIG. 6. Referring back to FIG. 4, PASR Manager 405 is expected to use services of mailbox driver 407 via standard ioctl (IO control interface). An ioctl, generally refers to "input-output control" which may be a device-specific system call. A driver can define an ioctl which allows a user space application to send it orders or requests. The ioctl( ) system call manipulates the underlying device parameters of special files. For example, operating characteristics of character special files like terminals can be controlled with ioctl( ) requests.

In some embodiments, PASR Manager 405 also interacts with Kernel memory manager 408. Kernel memory manager 408 manages the logical to physical translation of memory 409. Kernel memory manager 408 is aware of the type of memory, logical addresses of ZONE_NORMAL 201 and ZONE_MOVABLE 202, and whether PASR is being applied to the segments of the memory. In some embodiments, Kernel memory manager 408 is a linux memory management subsystem which is responsible for managing the memory in the system. This includes implementation of virtual memory and demand paging, memory allocation both for kernel internal structures and user space programs, and mapping of files into process address space, etc.

In some embodiments, PASR Manager 405 identifies a number of memory segments in memory 409 to be placed in the PASR mode based on a standby trigger event and next scheduled wake. In some embodiments, PASR Manager offlines identified segments based on the criteria discussed with reference to FIG. 3. As part of being offline, content from ZONE_MOVABLE 202 might either move to ZONE_NORMAL 201 or flushed to a disk (not shown). In some embodiments, offlined memory segments in ZONE_MOVABLE 202 are placed in PASR Mode via mailbox driver 407 which is invoked via 10 control calls from PASR Manager 405.

Figure 5:
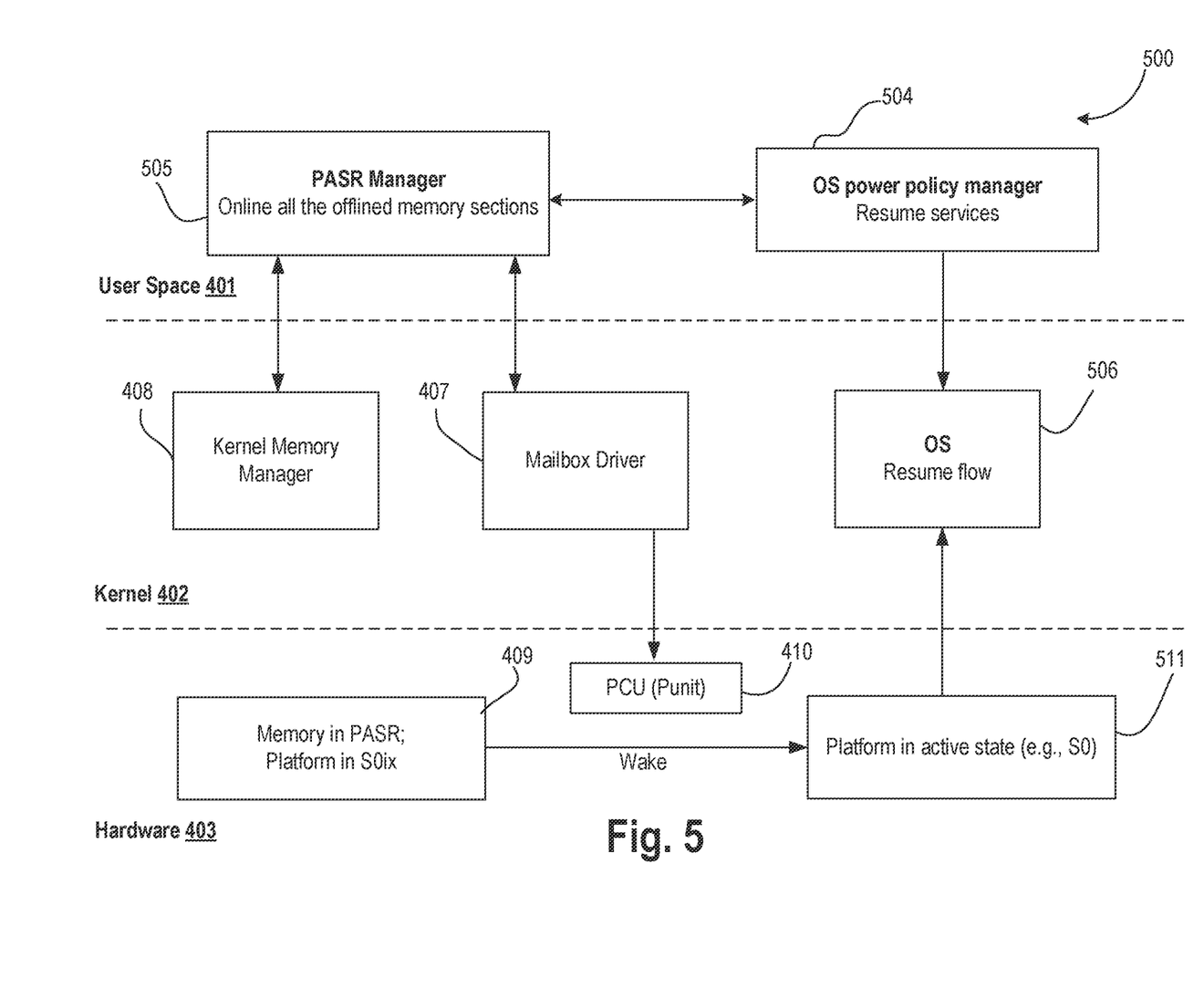
FIG. 5 illustrates a system-level flowchart for low power exit, in accordance with some embodiments.

FIG. 5 illustrates system-level flowchart 500 for low power exit (e.g., standby exit), in accordance with some embodiments. While various operation blocks are shown in a particular order, the order can be modified. For example, some blocks can be performed before others while some blocks can be performed simultaneously or parallel to other blocks. Here, labels for OS power policy manager 504 and PASR Manager 505 are updated to emphasize the functions of OS power policy manager 504 and PASR Manager 505 during standby exit as opposed to standby entry discussed with reference to FIG. 4. During standby exit, system platform completes wake from standby. In some embodiments, OS power policy manager 504 imitates PASR manager 505 using kernel mailbox driver 407. PASR manager 505 brings the offlined memory 202 out of PASR mode using kernel mailbox driver 407. As such, the platform comes out of low power mode SiOx as defined by the Advanced Configuration and Power Interface Specification, Revision 5.0 (ACPI 5.0 specification). At block 511, the platform moves from low power mode SiOx to active mode (e.g., S0 state as define by ACPI).

PASR manager 505 also brings online ZONE_MOVABLE memory section 202 using the operating system's memory online features in the operating system resume flow 506. In some embodiments, as part of resume flow 506 all processor cores which were powered down are powered up, all device drivers are resumed so that they are ready to handle any events and suspended user space tasks are thawed. At the end of the resume flow, system is back to operational mode to handle any user events. The ZONE_MOVABLE memory section 202 is now in self-refresh mode. As such, the entire memory is now available to the operating system for use.

In some embodiments, PASR manager 405/505 and/or mailbox driver 407 comprise program software code/instructions to implement embodiments of the disclosed subject matter. These program software code/instructions may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowcharts 300, 400, and/or 500 (and/or various embodiments) are executed by a computer system.

In some embodiments, the program software code/instructions associated with flowchart 300, 400, and/or 500 (and/or various embodiments) are stored in a computer executable storage medium and executed by a processor. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowcharts 300, 400, and/or 500 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, analog signals, digital signals, etc. through such tangible communication links.

In general, tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Nexus®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 6:
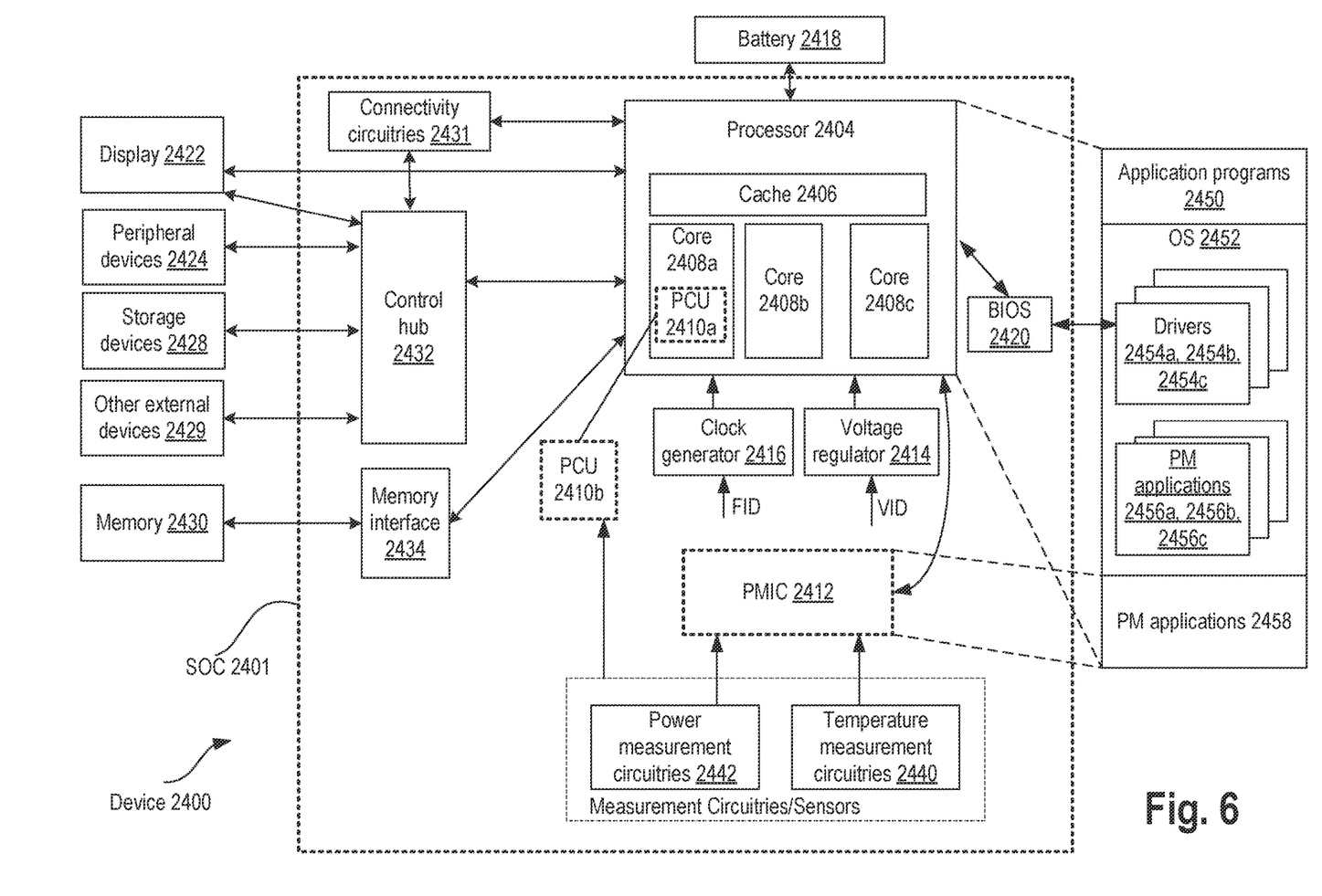
FIG. 6 illustrates a smart device or a computer system or an SoC (System-on-Chip) with hardware and software to manage memory to reduce power consumption, in accordance with various embodiments.

FIG. 6 illustrates a smart device or a computer system or an SoC (System-on-Chip) with hardware and software to manage memory to reduce power consumption, in accordance with various embodiments. It is pointed out that those elements of FIG. 6 having the same reference numbers (or names) as the elements of any other figure can operate or function in any manner similar to that described, but are not limited to such. In various embodiments, PCU 2410 executes firmware which interacts with the mailbox driver to communicate with a partial array self-refresh manger to improve standby battery life or power consumption. In some embodiments, drivers 2454a, 2454b, or 2454c implement mailbox driver 407. In some embodiments, PM applications 2456a, 2456b, or 2456c implement PASR manager 405 or 505.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 6, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 6, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, control hub 2432 provides a hardware-based wake detection and SoC firmware/software support, for servicing fixed display port (DP) and High Definition Multimedia Interface (HDMI) port hot plug events which allow a Universal Serial Bus (USB) Type-C subsystem to go into a powered off state (e.g., D3COLD state) while the fixed display is not streaming Upon receiving a display software-initiated wake for fixed display streaming in response to a hot plug detect, the SoC USB Type-C firmware triggers exit low-power state flow to power up the USB USB Type-C subsystem to handle the display traffic. The SoC USB Type-C firmware has the capability to autonomously re-enter the low power state (e.g., D3COLD state) when the fixed display(s) are not streaming.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors. In various embodiments, PCU 2410 executes firmware which interacts with the mailbox driver to communicate with a partial array self-refresh manger to improve standby battery life or power consumption.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1: An apparatus comprising: a memory which is logically partitioned into a first section and a second section, wherein the first section is online in a low power mode; logic to determine whether user memory in the second section is greater than available space in the first section; and a power control unit communicatively coupled to the memory, wherein the power control unit is to receive instructions from an operating system to move contents from the second section to the first section in response to a determination by the logic that the user memory in the second section is less than the available space in the first section.

Example 2: The apparatus of example 1, wherein the memory is a first memory, wherein the power control unit is to receive instructions from the operating system to move contents from the second section to a second memory separate from the first memory in response to a determination by the logic that the user memory in the second section is greater than the available space in the first section.

Example 3: The apparatus of example 1, wherein the logic is to determine or estimate a duration the apparatus is expected to stay in the low power mode.

Example 4: The apparatus of example 3, wherein the logic is to determine or estimate the duration via user behavior and/or heuristics.

Example 5: The apparatus of example 3, wherein the logic is to compare the duration with a threshold and to flush the contents of the second section and place the section in partial array self-refresh mode in response to a determination that the duration is longer than the threshold.

Example 6: The apparatus of example 5, wherein the logic is to: determine an imminent wakeup event from the low power mode in response to a determination that the duration is less than the threshold; identify a number of memory segments in the section to enter the partial array self-refresh mode in response to the determination that there is no imminent wakeup event; and bypass the partial array self-refresh mode and enable a self-refresh mode for the second section in response to the determination that there is an imminent wakeup event.

Example 7: The apparatus of example 3, wherein the logic is to determine whether a power down button was pressed to estimate the duration, and to flush the contents of the second section and place the section in partial array self-refresh mode in response to a determination that the power down button was pressed.

Example 8: The apparatus of example 7, wherein the logic is to determine whether a lid or display screen was shut and to estimate the duration and to determine an imminent wakeup event from the low power mode in response to a determination that lid or display screen was shut.

Example 9: The apparatus of example 8, wherein the logic is to: identify a number of memory segments in the section to enter the partial array self-refresh mode in response to the determination that there is no imminent wakeup event; and bypass the partial array self-refresh mode and enable a self-refresh mode for the second section in response to the determination that there is an imminent wakeup event.

Example 10: The apparatus of example 1, wherein the low power mode is a standby mode.

Example 11: The apparatus of example 1, wherein the memory is a dynamic random access memory.

Example 12: A machine-readable storage media having machine-executable instructions that when executed cause one or more processors to perform a method comprising: receiving a message that the processor is to enter a low power mode; and instructing, in response to receiving the message, a power control unit to move contents from a second section of a memory to a first section of the memory in response to a determination that user memory in the second section is less than an available space in the first section, wherein the first section is online in the low power mode.

Example 13: The machine-readable storage media of example 12, wherein the memory is a first memory, wherein the machine-readable storage media having machine-executable instructions that when executed cause the one or more processors to perform the method comprising: instructing the power control unit to move contents from the second section to a second memory separate from the first memory in response to a determination that the user memory in the second section is greater than the available space in the first section.

Example 14: The machine-readable storage media of example 12 having machine-executable instructions that when executed cause the one or more processors to perform the method comprising: determining or estimating a duration the one or more processors is expected to stay in the low power mode.

Example 15: The machine-readable storage media of example 14 having machine-executable instructions that when executed cause the one or more processors to perform the method comprising: determining or estimating the duration via user behavior and/or heuristics.

Example 16: The machine-readable storage media of example 15 having machine-executable instructions that when executed cause the one or more processors to perform the method comprising: comparing the duration with a threshold; and instructing the power control unit to flush the contents of the second section and place the section in partial array self-refresh mode in response to a determination that the duration is longer than the threshold.

Example 17: The machine-readable storage media of example 16 having machine-executable instructions that when executed cause the one or more processors to perform the method comprising: determining an imminent wakeup event from the low power mode in response to a determination that the duration is less than the threshold; identifying a number of memory segments in the section to enter the partial array self-refresh mode in response to the determination that there is no imminent wakeup event; and bypassing the partial array self-refresh mode and enable a self-refresh mode for the second section in response to the determination that there is an imminent wakeup event.

Example 18: The machine-readable storage media of example 16 having machine-executable instructions that when executed cause the one or more processors to perform the method comprising: determining whether a power down button was pressed to estimate the duration; and instructing the power control unit to flush the contents of the second section and place the section in partial array self-refresh mode in response to a determination that the power down button was pressed.

Example 19: The machine-readable storage media of example 16 having machine-executable instructions that when executed cause the one or more processors to perform the method comprising: determining whether a lid or display screen was shut to estimate the duration; and determining an imminent wakeup event from the low power mode in response to a determination that lid or display screen was shut.

Example 20: The machine-readable storage media of example 19 having machine-executable instructions that when executed cause the one or more processors to perform the method comprising: identifying a number of memory segments in the section to enter the partial array self-refresh mode in response to the determination that there is no imminent wakeup event; bypassing the partial array self-refresh mode and enable a self-refresh mode for the second section in response to the determination that there is an imminent wakeup event.

Example 21: A system-on-chip comprising: a dynamic random access memory which is logically partitioned into a first section and a second section, wherein the first section is online in a low power mode; a software module to determine whether user memory in the second section is greater than available space in the first section; and a processor communicatively coupled to the dynamic random access memory; a power control unit communicatively coupled to the dynamic random access memory and the processor, wherein the power control unit is to receive instructions from an operating system to move contents from the second section to the first section in response to a determination by the software module that the user memory in the second section is less than the available space in the first section; a wireless interface communicatively coupled to the processor.

Example 22: The system of example 21, wherein the power control unit is to receive instructions from the operating system to move contents from the second section to a non-volatile memory in response to a determination by the software module that the user memory in the second section is greater than the available space in the first section.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a memory which is logically partitioned into a first section and a second section, wherein the first section is online in a low power mode when the apparatus is in a low power mode;
logic to determine whether user memory in the second section is greater than or less than available space in the first section; and
a power control unit communicatively coupled to the memory, wherein:
if the logic determines that the user memory is less than the available space in the first section, the power control unit is to move contents from the second section to the first section;
if the logic determines that the user memory is greater than the available space in the first section, the logic is to determine or estimate a duration the apparatus is expected to stay in the low power mode;
if the duration is longer than a threshold, the logic is to flush contents of the second section and place the second section in partial array self-refresh mode;
if the duration is not longer than the threshold, the logic is to determine whether there is an imminent wakeup event;
if there is not the imminent wakeup event, the logic is to identify a number of memory segments in the second section to enter the partial array self-refresh mode; and
if there is the imminent wakeup event, the logic is to bypass the partial array self-refresh mode and enable a self-refresh mode for the second section.

2. The apparatus of claim 1, wherein the power control unit is to move contents from the second section to an external non-volatile memory in response to a determination by the logic that the user memory less than the available space in the first section.

3. The apparatus of claim 1, wherein the logic is to determine or estimate the duration via user behavior and/or heuristics.

4. The apparatus of claim 1, wherein to determine or estimate the duration, the logic is to determine whether a power down button of the apparatus was pressed.

5. The apparatus of claim 1, wherein to determine or estimate the duration, the logic is to determine whether a lid or display screen of the apparatus was shut.

6. The apparatus of claim 1, wherein the low power mode is a standby mode.

7. The apparatus of claim 1, wherein the memory is a dynamic random access memory.

8. The apparatus of claim 1, wherein the logic is to determine or estimate the duration based on a time of day in which the apparatus is placed in the low power mode.

9. The apparatus of claim 1, wherein the logic is to determine or estimate the duration based on whether the apparatus is placed in the low power mode in night time.

10. The apparatus of claim 1, wherein the logic is to determine or estimate the duration based on a time of week in which the apparatus is placed in the low power mode, including whether the time of week is during a work week.

11. The apparatus of claim 1, wherein the logic is to determine or estimate the duration based on a pattern of user behavior over days, weeks or months, and the pattern indicates when the user is expected to enter the apparatus into the low power mode and when the apparatus is expected to exit the low power mode.

12. The apparatus of claim 1, wherein the logic is to determine whether there is the imminent wakeup event based on a real time clock alarm.

13. A machine-readable storage media having machine-executable instructions that when executed cause a processor to:
   receive a message that the processor is to enter a low power mode, wherein a first section of a memory is online in the low power mode;
   determine, in response to receiving the message, whether user memory in a second section of the memory is greater than or less than available space in the first section;
   if the user memory is greater than the available space in the first section, determine or estimate a duration the processor is expected to stay in the low power mode;
      if the duration is longer than a threshold, flush contents of the second section and place the second section in a partial array self-refresh mode;
      if the duration is not longer than the threshold, determine whether there is an imminent wakeup event;
      if there is not the imminent wakeup event, identify a number of memory segments in the second section to enter the partial array self-refresh mode; and
      if there is the imminent wakeup event, bypass the partial array self-refresh mode and enable a self-refresh mode for the second section.

14. The machine-readable storage media of claim 13, where the instructions when executed cause the processor to:
   determine or estimate the duration via user behavior and/or heuristics.

15. The machine-readable storage media of claim 13, wherein to determine or estimate the duration, the instructions when executed cause the processor to
   determine whether a power down button was pressed.

16. The machine-readable storage media of claim 13, wherein to determine or estimate the duration, the instructions when executed cause the processor to determine whether a lid or display screen was shut.

17. The machine-readable storage media of claim 13, wherein the determination of whether there is the imminent wakeup event is based on a real time clock alarm.

18. An apparatus, comprising:
   a dynamic random access memory which is logically partitioned into a first section and a second section, wherein the first section is online in a low power mode;
   a software module to determine whether user memory in the second section is greater than available space in the first section;
   a processor communicatively coupled to the dynamic random access memory; and
   a power control unit communicatively coupled to the dynamic random access memory and the processor, wherein the power control unit is to:
      determine whether there is an imminent wakeup event in response to a determination by the software module that the user memory is greater than the available space in the first section;
      if there is not the imminent wakeup event, identify a number of memory segments in the second section to enter a partial array self-refresh mode; and
      if there is the imminent wakeup event, bypass the partial array self-refresh mode and enable a self-refresh mode for the second section.

19. The apparatus of claim 18, wherein the power control unit is to move contents from the second section to a non-volatile memory in response to a determination by the software module that the user memory is less than the available space in the first section.

20. The apparatus of claim 18, wherein the power control unit is to move contents from the second section to the first section in response to a determination by the software module that the user memory is less than the available space in the first section.

21. The apparatus of claim 18, wherein the determination of whether there is the imminent wakeup event is based on a real time clock alarm.

* * * * *

UNITED STATES PATENT AND TRADEMARK OFFICE
CERTIFICATE OF CORRECTION

| | | |
|---|---|---|
| PATENT NO. | : 11,520,498 B2 | Page 1 of 1 |
| APPLICATION NO. | : 17/116991 | |
| DATED | : December 6, 2022 | |
| INVENTOR(S) | : Nadav Bonen et al. | |

It is certified that error appears in the above-identified patent and that said Letters Patent is hereby corrected as shown below:

In the Claims

Column 22
Line 34, "...the user memory less than..." should read --...the user memory is less than...--

Column 23
Line 7, "...in response to receiving the message..." should read --...in response to the message...--

Signed and Sealed this
Seventeenth Day of September, 2024

*Katherine Kelly Vidal*

Katherine Kelly Vidal
*Director of the United States Patent and Trademark Office*